United States Patent

[11] 3,549,960

[72] Inventor Bruce D. Wedlock
Arlington, Mass.
[21] Appl. No. 692,118
[22] Filed Dec. 20, 1967
[45] Patented Dec. 22, 1970
[73] Assignee Massachusetts Institute of Technology
Cambridge, Mass.
a corporation of Massachusetts

[54] THERMO-PHOTOVOLTAIC CONVERTER HAVING BACK-SURFACE JUNCTIONS
7 Claims, 5 Drawing Figs.

[52] U.S. Cl. .......... 317/235,
317/234; 250/211, 313/108
[51] Int. Cl. .......... H01l 15/02,
H01l 5/00, H01l 5/02
[50] Field of Search .......... 317/234,
5.4, 235, 27, 43; 250/211; 313/108; 250/211

[56] References Cited
UNITED STATES PATENTS

| | | | |
|---|---|---|---|
| 2,986,591 | 5/1961 | Swanson et al. | 136/89 |
| 3,012,305 | 12/1961 | Ginsbach | 29/25.3 |
| 3,212,940 | 10/1965 | Blankenship | 148/1.5 |
| 3,324,297 | 6/1967 | Stieltjes et al. | 250/211 |
| 3,374,404 | 3/1968 | Luecke | 317/234 |
| 3,396,317 | 8/1968 | Vendelin | 317/234 |
| 3,445,686 | 5/1969 | Rutz | 307/299 |
| 2,820,154 | 1/1958 | Kurshan | 307/88.5 |

*Primary Examiner*—John W. Huckert
*Assistant Examiner*—B. Estrin
*Attorneys*—Thomas Cooch, Martin M. Santa and Joseph J. Alekshun, Jr.

ABSTRACT: A thermophotovoltaic energy converter comprising a germanium wafer with interdigital or finger junctions on the surface of the wafer opposite that on which radiant energy impinges is described. The germanium wafer may be intrinsic, in which case the fingers are *p* and *n* type. If the germanium wafer is *n* type, the fingers are *p* and ohmic junctions.

PATENTED DEC 22 1970

3,549,960

INVENTOR
BRUCE D. WEDLOCK
BY [signature]
ATTORNEY

THERMO-PHOTOVOLTAIC CONVERTER HAVING BACK-SURFACE JUNCTIONS

The use of *p–n* junctions as a source of electrical power from a thermal radiant energy source is well known. To be efficient, the contacts to the *p* and *n* regions should have low resistance to the flow of output current. The contact on the side of the *p–n* wafer nearest the source of radiant energy must now block the illumination of the wafer while still providing low resistance. For this reason the contact is fabricated in the form of fingers which geometry is an attempt to provide low radiant energy-blocking and low resistance. In addition, the surface of the wafer upon which the radiant energy impinges should be treated by film evaporation or a similar technique to provide good transmission of the radiant energy into the interior of the wafer. It is difficult to provide the desired surface treatment where provision must also be made for the contact "fingers."

It is accordingly an object of this invention to provide a thermophotovoltaic diode which is efficient in the sense of having low resistance to the flow of current and in having a surface upon which the radiant energy impinges which is free of obstructing "finger" contacts.

THE INVENTION

Figure 1:
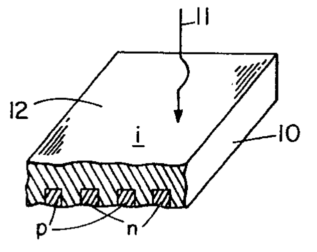

FIG. 1 (*a*) is a cross-sectional sectional view of a *p–i–n* diode constructed in accordance with the invention.

FIG. 1(*b*) is a bottom view of the *p–i–n* diode showing the interdigital junctions.

Figure 2:
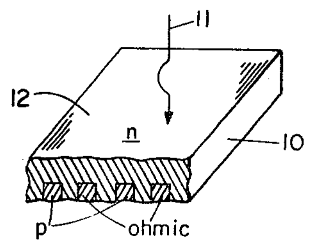
Figure 1:
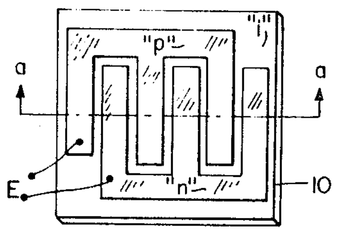
Figure 2:
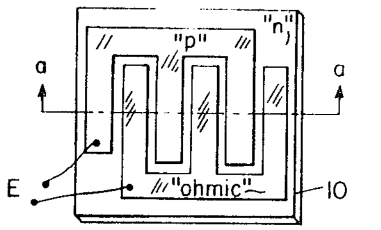

FIGS. 2(*a*) and 2(*b*) are corresponding views of a *p–n* diode.

Figure 3:
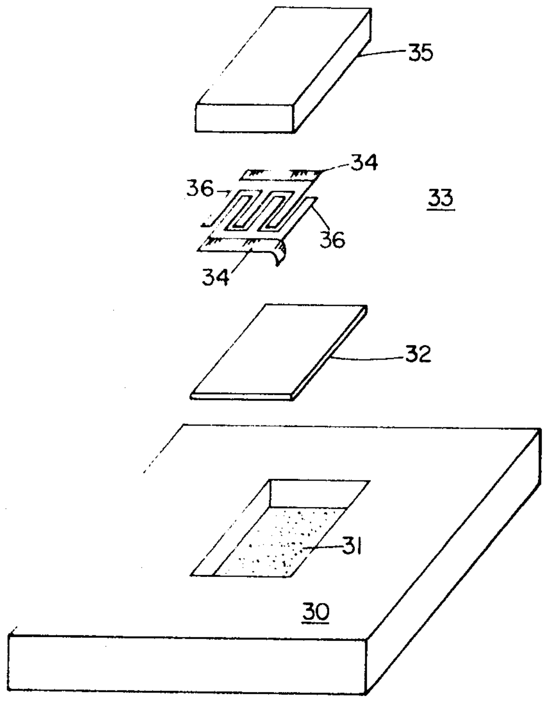

FIG. 3 depicts the alloying jig used in fabricating the diode of this invention.

In the device of this invention, electrical contact to the wafer 10 is made on the side remote from the incident radiant energy 11; and, therefore, there is no problem of blocking the incident radiant energy, and the contacts may cover essentially the entire remote side of the wafer. The contacts are formed as interleaving "fingers " of *p-* and *n*-type material if the body of the wafer 10 is intrinsic *i* material as in FIG. 1 or the fingers may be of *p-* and ohmic-type material if the wafer 10 is of *n* type material as in FIG. 2. This construction gives lower output resistance and higher utilization of radiant energy per unit area than the prior art.

The surface 12 of the wafer 10 on which the radiant energy impinges being unimpeded by contacts may be treated using known evaporated film techniques to produce good transmission characteristics for the frequency range of the radiant energy which is best utilized by the particular material of the wafer for conversion into electrical power.

DIODE FABRICATION

The procedure for producing a *p–i–n* diode is given in the following sections.

PREPARATION OF GERMANIUM BLANKS

Wafers were cut from a single crystal of 40 ohm-cm. germanium using a diamond-bladed saw. The large flat faces were in the (111) crystal plane since this plane gives the most uniform alloy junctions.

Both sides of the wafer were then lapped using a 14.5 $\mu$ $Al_2O_3$ lapping powder. The lapping removes saw damage from the surfaces of the wafers and reduces their thickness to the depth desired. Wafers were prepared with thicknesses ranging from 0.3 mm. to 0.15 mm. Due to the possibility of breakage it was not practical to lap wafers thinner than 0.15 mm.

The lapped wafers were then mounted on glass slides with pitch and cut into 1 cm. Squares using the diamond-bladed saw. This size was chosen because, for high electrical output in the final device, it is desirable to have as large an area as can easily be handled. After cutting, the square blanks were removed from the glass slides by soaking them in trichloroethylene to dissolve the pitch. The blanks were cleaned in fresh trichloroethylene and rinsed in methyl alcohol.

Two blanks cut from the same wafer were then mounted on the steel cylinder of a polishing jig with glycol phthalate. The germanium squares were polished on metallurgical polishing wheels using first Linde A for approximately half an hour and then Linde B for about 5 minutes. At this point the germanium has a mirrorlike front surface. The squares were removed from the polishing jig by heating and then rinsed successively in acetone, trichloroethylene, and methyl alcohol.

The squares were then mounted on glass slides with their polished faces toward the glass; they were secured with Apiezon W wax. The lapped surface of the germanium squares was etched for about 2 minutes in a solution consisting of 40 ml. $H_2O$, 10 ml. $H_2O_2$ (30 percent) and 10 ml. HF. This etch leaves the surface slightly shiny, and it was found that such a surface was best for alloying. Also, this etch has been shown to produce surfaces with a very low surface recombination velocity.

The squares were removed from the glass slides by dissolving the wax in trichloroethylene and were then rinsed in methyl alcohol. The squares were etched again for about 30 seconds using the same etch. This second etch removes the surface damage from the front surface that had resulted from polishing but is not long enough to destroy the mirrorlike appearance of that surface. The germanium blanks are now ready for alloying.

PREPARATION OF ALLOY CONTACTS

To produce a *p–i–n* diode of the type shown in FIG. 1, an interdigital array of alloy junctions must be produced. To accomplish this, the following method was developed.

For the *p*-type alloying agent, indium-gallium (0.5 percent gallium) foil 0.005-inches thick was used. For the *n*-type alloying agent, a tin-antimony (1 percent) foil of the same thickness was used. The foil was cut into approximately 1 cm. squares. These were degreased in trichloroethylene and methyl alcohol and flattened between clean glass slides. A thin layer of Kodak Photo Resist (KPR) was applied to one side of the foil in a darkroom. The foil was then baked under an infrared lamp for 45 minutes to dry the KPR.

To produce the interdigital arrays, a film negative was made of pattern like that of the *p* or *n* regions of FIG. 1(*b*). This negative was placed on top of the KPR-coated foil squares and exposed under a flood lamp for 10 minutes. After exposure, the foil was placed in KPR developer for 1 minute and then rinsed in methyl alcohol. A resist mask was then visible on the foil.

The foil squares were next mounted, resist side up, on a glass slide using Apiezon W wax. This protects the back side of the foil while etching. The foil squares were etched in a solution of 3 molar ferric chloride. Separate etch baths were used for the tin and indium foils to prevent contamination of either. The foil was etched for about 1 hour until the finger arrays were produced.

The etched-out foil fingers were removed from 3 glass slides from dissolving the wax in trichloroethylene. The indium fingers were then etched for 15 seconds in a solution consisting of 360 ml. $H_2O$, 4 ml. $H_2O_2$ (30 percent), 20 ml. HF, and 20 ml. $HNC_3$. This removes the KPR and surface oxides from the indium and leaves the foil very shiny. Similarly, the tin fingers were etched in dilute hydrochloric acid. After etching, the foil fingers were rinsed in demineralized water and allowed to dry. The foil was flattened between two glass slides which has been covered with clean plastic electrical tape to prevent the foil from sticking to the glass. The foil fingers are now ready for alloying.

ALLOYING

For alloying, a jig 30 shown in FIG. 3 was made from spectroscopically pure graphite. The small graphite insert 31 serves as a flat surface on which to lay the germanium blank 32 and leaves a slit between its sides and the walls of the jig in which the lead attachment can be made. The germanium blank 32 was placed polished side down on top of this insert 31 inside the jig 30. The foil fingers 36 were then placed on top of the germanium blank and positioned in an interdigital array 33. To provide electrical terminals for the diodes, a thin nickel strip 34, 0.1 cm. wide, was laid on top of the base leg of each set of foil fingers. These strips were made 0.3 cm. longer than the germanium square 32. The excess length of nickel was bent to form a small tab at right angles to the strip and was fitted in the slot between the flat graphite insert and the wall of the jig. Once everything was positioned correctly, pure graphite powder was sifted through a fine wire mesh into the jig until it evenly covered the fingers and contacts. It was then packed down tightly and the top graphite plug 35 was inserted. The powdered graphite is used to hold the molten indium and tin in place during alloying.

The graphite jig was then slowly inserted into a vycor tube which ran horizontally through the center of an electric furnace. The temperature of the jig was monitored with a thermocouple and was raised to 525° where it was kept for 10 minutes. The furnace was then turned down and the jig was allowed to cool to room temperature at approximately 5°C./mi nute. The slow cooling rate was used to preserve the lifetime of the germanium and to prevent cracking of the thin diode due to the difference in the coefficients of thermal expansion between the germanium and the alloying metal. During the alloying process, the jig was kept in a reducing atmosphere by passing forming gas, consisting of 80percent nitrogen and 20 percent hydrogen, through a Deoxo unit, a liquid nitrogen cold trap, and then into the vycor tube containing the jig.

After the jig had cooled to room temperature, the diodes were removed and cleaned in methyl alcohol using an ultrasonic cleaner to remove the powdered graphite.

The diode was then anodically etched to clean up the *p*-junction. Prior to this etching, the front surface was coated with Apiezon W wax to protect them. The diode was etched in a 10 percent solution of potassium hydroxide. The indium junction was made positive and a piece of platinum wire was used as a negative terminal. A current of several hundred milliamps was passed through the solution for about 1 minute. The diode was then rinsed in demineralized water, methyl alcohol, trichloroethylene, and methyl alcohol again. This removed the wax from the front surface. This etching improved the reverse characteristics of the diodes considerably.

MOUNTING

The back surface of the diodes was coated with Dow-Corning heat sinking compound and then placed on an anodized aluminum wafer. Electrical contact was made to the diode by soldering silver wires to the nickel tabs and connecting these leads to two binding posts which had been epoxied to the aluminum wafer.

There has been described a method for fabricating an interdigital *p–i–n* diode using an alloying process starting from a foil of the doping materials in the shape of fingers. The same process could be used to produce the *p–n* diode of FIG. 2. The foil process limitations on the closeness of the fingers to one another and their minimum width. However, the foil process is capable of producing very heavy dopings.

The diodes may also be constructed using standard evaporation techniques. The fingers can be made narrow and more closely spaced if evaporation is used. However, in order to get the heavy dopings required, the evaporation must be carried on for a long time.

I claim:

1. A thermophotovoltaic diode responsive to radiant energy to provide an electrical output across its junctions comprising:
a wafer of intrinsic germanium;
a *p*-type junction in the form of fingers on one side of said wafer;
an *n*-type junction in the form of fingers on the same one side of said wafer; and the
*n*- and *p*-type fingers being arranged to form an interdigital array;
said wafer of germanium being of a thickness sufficient to absorb the radiant energy incident upon the wafer on the side opposite the interdigital array.

2. The diode of claim 1 wherein said junctions are alloy junctions.

3. The diode of claim 2 wherein:
said *p*-type alloy junction is formed of indium-gallium; and
said *n*-type alloy junction is formed of tin-antimony.

4. The diode of claim 2 comprising in addition:
an evaporated film suitable for allowing transmission of incident radiant energy of a desired frequency range;
said film being evaporated on the other side of said wafer from said interdigital array; and
said other side being an optically polished surface prior to evaporation of said film on said side.

5. The diode of claim 1 wherein said junctions are diffused junctions.

6. The diode of claim 1 wherein said germanium is not greater than 0.3 mm. thick.

7. The diode of claim 1 wherein said interdigital fingers cover substantially all the surface of the side of the wafer on which they are formed to substantially block all radiant energy incident on that surface from impinging upon said germanium.